(12) United States Patent
Lee (10) Patent No.: US 10,194,109 B2
(45) Date of Patent: Jan. 29, 2019

(54) DATA TRANSFER CIRCUIT USING DIGITAL TRANSFER AND IMAGE SENSOR

(71) Applicant: SAMSUNG ELECTRONICS CO., LTD., Suwon-si, Gyeonggi-do (KR)

(72) Inventor: Hyeok Jong Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 15/295,551

(22) Filed: Oct. 17, 2016

(65) Prior Publication Data

US 2017/0127006 A1 May 4, 2017

(30) Foreign Application Priority Data

Oct. 30, 2015 (KR) ........................ 10-2015-0151769

(51) Int. Cl.
*H04N 5/376* (2011.01)
*H04N 5/378* (2011.01)
*H01L 27/146* (2006.01)
*H04N 5/3745* (2011.01)

(52) U.S. Cl.
CPC ... *H04N 5/37455* (2013.01); *H01L 27/14612* (2013.01); *H01L 27/14643* (2013.01); *H04N 5/378* (2013.01); *H04N 5/3765* (2013.01)

(58) Field of Classification Search
CPC .. H04N 5/37455; H04N 5/3765; H04N 5/378; H04N 27/14612; H04N 27/14643
See application file for complete search history.

(56) References Cited

U.S. PATENT DOCUMENTS

| | | | |
|---|---|---|---|
| 6,747,700 | B1 | 6/2004 | Funakoshi et al. |
| 6,836,290 | B1 * | 12/2004 | Chung ................ H04N 5/335 326/81 |
| 7,728,894 | B2 | 6/2010 | Chou |
| 7,948,544 | B2 | 5/2011 | Park et al. |
| 8,026,891 | B2 | 9/2011 | Kim et al. |

(Continued)

FOREIGN PATENT DOCUMENTS

| | | |
|---|---|---|
| JP | 2009253556 | 10/2009 |
| JP | 2014116750 | 6/2014 |
| KR | 00357690 | 10/2002 |

*Primary Examiner* — Jason A Flohre
(74) *Attorney, Agent, or Firm* — Volentine, Whitt & Francos, PLLC (57) ABSTRACT

A data transfer circuit includes a first layer for transmitting first bits and a second layer for transmitting second bits. Each of the first layer and the second layer includes: first to $m^{th}$ banks configured to convert a plurality of received digital pixel signals into first to $m^{th}$ analog voltage signals, wherein 'm' denotes an integer which is greater than or equal to '2'; first to $m^{th}$ samplers configured to convert the first to $m^{th}$ analog voltage signals into first to $m^{th}$ digital transmission signals; and first to $m^{th}$ digital transfer units configured to respectively receive the first to $m^{th}$ digital transmission signals.

18 Claims, 9 Drawing Sheets

(56) References Cited

U.S. PATENT DOCUMENTS

| | | | |
|---|---|---|---|
| 8,432,761 B2 | 4/2013 | Kim et al. | |
| 8,797,063 B2 | 8/2014 | Choo et al. | |
| 9,294,703 B2* | 3/2016 | Choo | H04N 5/3742 |
| 2006/0176205 A1* | 8/2006 | Kawahito | H03M 1/164 |
| | | | 341/155 |
| 2008/0266150 A1* | 10/2008 | Suzuki | H03M 9/00 |
| | | | 341/100 |
| 2008/0303931 A1* | 12/2008 | Taguchi | H04N 5/335 |
| | | | 348/308 |
| 2009/0026352 A1* | 1/2009 | Shimomura | H04N 5/3742 |
| | | | 250/214 R |
| 2014/0151534 A1* | 6/2014 | Choo | H04N 5/378 |
| | | | 250/208.1 |
| 2014/0333816 A1* | 11/2014 | Uchida | H04N 5/37455 |
| | | | 348/308 |
| 2017/0353684 A1* | 12/2017 | Wang | H04N 5/374 |

\* cited by examiner

DATA TRANSFER CIRCUIT USING DIGITAL TRANSFER AND IMAGE SENSOR

CROSS-REFERENCE TO RELATED APPLICATION

This application claims the benefit of Korean Patent Application No. 10-2015-0151769, filed on Oct. 30, 2015, in the Korean Intellectual Property Office, the disclosure of which is incorporated herein in its entirety by reference.

BACKGROUND

One or more embodiments of the disclosure relate to a data transfer circuit and a portable electronic device including the same.

Recently, as CMOS image sensors (CISs) have been used in various fields and the number of pixels thereof has been increased, the amount of data to be transmitted using a data transfer circuit has increased.

In order to increase a transfer speed of the data transfer circuit, the data transfer circuit is configured to have a bank structure and to transmit data by using a small-swing signal.

A CMOS data transfer circuit includes a sampler and a data lane. The amounts of power consumed by the sampler and the data lane are constant regardless of the value of data.

Accordingly, a large amount of power is consumed in the data transfer circuit.

SUMMARY

According to an aspect of the disclosure, a data transfer circuit includes a first layer configured to transmit first bits and a second layer configured to transmit second bits. Each of the first layer and the second layer includes: first to $m^{th}$ banks configured to convert a plurality of received digital pixel signals into first to $m^{th}$ analog voltage signals, wherein 'm' denotes an integer which is greater than or equal to '2'; first to $m^{th}$ samplers configured to convert the first to $m^{th}$ analog voltage signals into first to $m^{th}$ digital transmission signals; and first to $m^{th}$ digital transfer units configured to respectively receive the first to $m^{th}$ digital transmission signals.

The data transfer circuit may further include first to $m^{th}$ bus units configured to receive the first to $m^{th}$ analog voltage signals from the first to $m^{th}$ banks and transmit the first to $m^{th}$ analog voltage signals to the first to $m^{th}$ samplers.

The first to $m^{th}$ samplers may be respectively connected to the first to $m^{th}$ digital transfer units.

The first to $(m-1)^{th}$ samplers may be respectively connected to the second to $m^{th}$ banks. The $m^{th}$ sampler may be connected to an application processor.

The first to $m^{th}$ digital transfer units may be connected in series to each other so as to transmit signals. The $m^{th}$ digital transfer unit may be connected to the application processor.

The first to $m^{th}$ samplers of the first layer may respectively transmit the first to $m^{th}$ digital transmission signals to the first to $m^{th}$ digital transfer units.

The first to $(m-1)^{th}$ samplers of the second layer may respectively transmit the first to $(m-1)^{th}$ digital transmission signals to the second to $m^{th}$ banks.

A ratio of the first bits to the second bits may be variable.

The first bits may be upper bits, and the second bits may be lower bits,

The first to $m^{th}$ samplers may be synchronization circuits operating according to a clock signal.

Each of the first to $m^{th}$ data transmission units may include a D-flip-flop; and a multiplexer connected to a corresponding sampler among the second to $m^{th}$ samplers and the D-flip-flop.

The D-flip-flop may be a synchronization circuit operating according to a clock signal.

The multiplexer may output one of input signals on the basis of selection information.

According to another aspect of the disclosure, an image sensor includes a pixel array including a plurality of pixels; and a readout block configured to receive a plurality of analog pixel signals from the pixel array. The readout block includes an analog-digital converter block configured to convert the plurality of analog pixel signals into a plurality of digital pixel signals. A data transfer circuit serializes the plurality of digital pixel signals and transmits the plurality of digital pixel signals to an application processor. The data transfer circuit includes a first layer and a second layer. The first layer transmits first bits of each of the plurality of digital pixel signals to the application processor by using a first transmission method. The second layer transmits second bits of each of the plurality of digital pixel signals to the application processor by using a second transmission method.

The first bits may be upper bits and the second bits may be lower bits. A ratio of the first bits to the second bits may be variable.

The first transmission method may be a method of sequentially transmitting the first bits of each of the plurality of digital transmission signals to the application processor by the first layer via first to $m^{th}$ digital transfer units to which the first layer is connected in series.

The second transmission method may be a method of sequentially transmitting the second bits of each of the plurality of digital transmission signals to the application processor by the second layer via first to $m^{th}$ banks and first to $m^{th}$ samplers.

The first to $m^{th}$ samplers may be synchronization circuits operating according to a clock signal.

The first to $m^{th}$ samplers may be respectively connected to the first to $m^{th}$ digital transfer units.

The first to $(m-1)^{th}$ samplers may be respectively connected to the second to $m^{th}$ banks. The $m^{th}$ sampler may be connected to the application processor.

The first to $m^{th}$ digital transfer units may be connected in series to each other to transmit signals. The $m^{th}$ digital transfer unit may be connected to the application processor.

The first to $m^{th}$ samplers of the first layer may respectively transmit the first to $m^{th}$ digital transmission signals to the first to $m^{th}$ digital transfer units.

The first to $(m-1)^{th}$ samplers of the second layer may respectively transmit the first to $(m-1)^{th}$ digital transmission signals to the second to $m^{th}$ banks.

According to another aspect of the disclosure, a data transfer circuit serializes a plurality of digital pixel signals and transmits the plurality of digital pixel signals to an application processor. The data transfer circuit includes a first layer that transmits first bits of each of the plurality of digital pixel signals to the application processor using a first transmission method and a second layer that transmits second bits of each of the plurality of digital pixel signals to the application processor using a second transmission method.

The first transmission method may be a non-differential-signal transmission of the digital pixel signals, and the second transmission method may be a differential-signal transmission of the digital pixel signals.

Each of the first layer and the second layer may include first to $m^{th}$ banks configured to convert the digital pixel signals into first to $m^{th}$ analog voltage signals, wherein 'm' denotes an integer which is greater than or equal to '2'; first to $m^{th}$ samplers configured to convert the first to $m^{th}$ analog voltage signals into first to $m^{th}$ digital transmission signals; and first to $m^{th}$ digital transfer units configured to respectively receive the first to $m^{th}$ digital transmission signals.

The first transmission method may be a non-differential-signal transmission of the digital pixel signals through the $m^{th}$ digital transfer unit, and the second transmission method may be a differential-signal transmission of the digital pixel signals through the $m^{th}$ sampler.

The first bits may be upper bits and the second bits may be lower bits. And a ratio of the first bits to the second bits may be variable.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EMBODIMENTS

The disclosure now will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, exemplary embodiments of the disclosure will be described in detail with reference to the accompanying drawings.

Figure 1A:
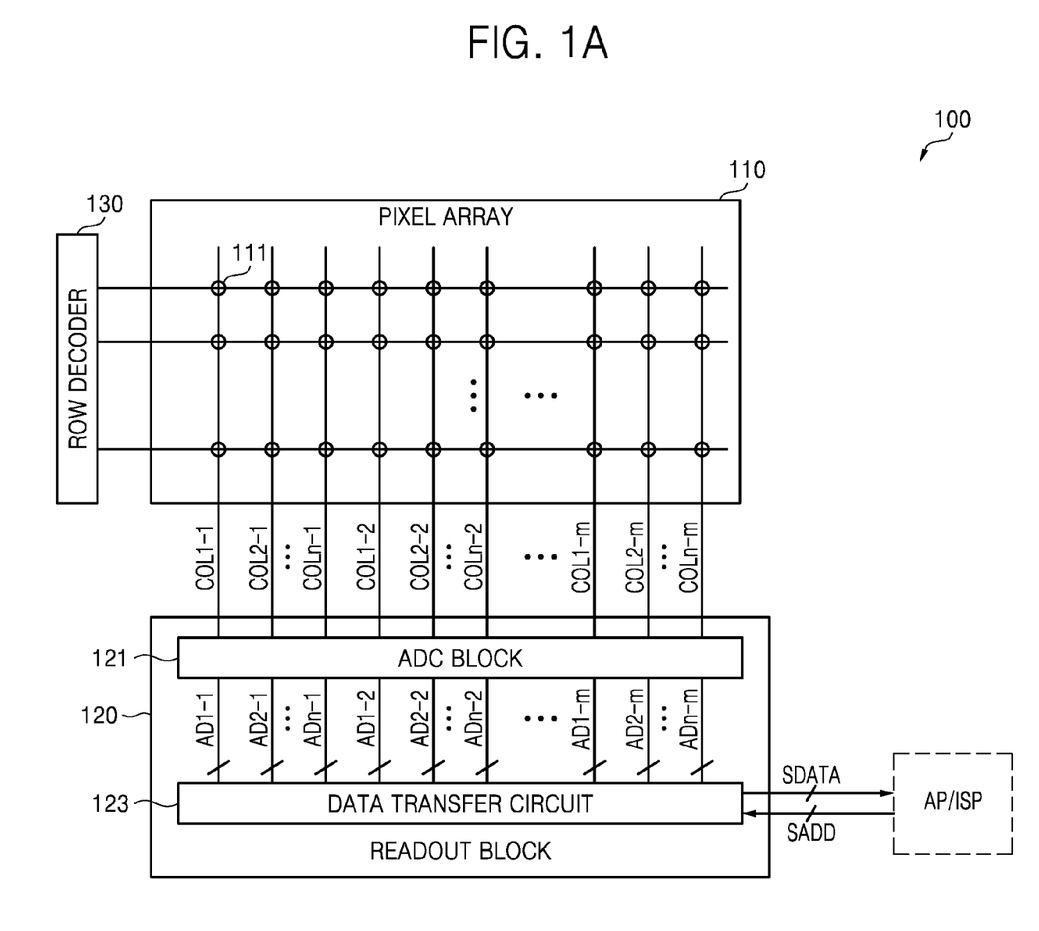
FIG. 1A is a block diagram of an image sensor according to an embodiment of the disclosure.

FIG. 1A is a block diagram of an image sensor 100 according to an embodiment of the disclosure. Referring to FIG. 1A, the image sensor 100 may include a pixel array 110, a readout circuit 120, and a row decoder 130.

The pixel array 110 may include a plurality of pixels 111 embodied as a two-dimensional (2D) matrix. Each of the plurality of pixels 111 may include one photosensor (not shown), such as a photodiode, and a number of transistors (not shown), such as '3', '4', or '5' transistors. The plurality of pixels 111 in one row of the 2D matrix may generate analog pixel signals COL1-1 to COLn-m. Here, 'n' and 'm' each denote a natural number.

Hereinafter, the natural number 'n' may represent the number of pixel signals (analog pixel signals COL or digital pixel signals AD) to be processed by each of banks 201 of FIG. 2. For example, 128, 256, or 512 pixel signals may be processed by each of the banks 201 but the disclosure is not limited thereto.

Hereinafter, the natural number 'm' may represent the number of the banks 201 of FIG. 2.

Thus, the readout circuit 120 may receive a total of n×m analog pixel signals COL1-1 to COLn-m for each row of the 2D matrix.

The readout circuit 120 may process the analog pixel signals COL1-1 to COLn-m output from columns of the pixel array 110, and transmit serial data SDATA corresponding to a result of processing the analog pixel signals COL1-1 to COLn-m to an application processor (AP) or an image signal processor (ISP) via a serial interface (not shown).

In one embodiment, the serial interface may be, but is not limited to, a serial advanced technology attachment (SATA) interface, a SATA express (SATAe) interface, a serial attached small (SAS) computer system interface (SCSI), a peripheral component interconnect express (PCIe) interface, a non-volatile memory Express (NVMe) interface, an advanced host controller interface (AHCI), or a multimedia card (MMC) interface. In one embodiment, electrical signals or optical signals may be transmitted via the serial interface.

The serial data SDATA corresponding to one analog pixel signal may be x-bit data. Here, 'x' denotes a natural number.

The serial data SDATA may include upper bit data HDATA and lower bit data LDATA. For example, when it is assumed that 'x' is '8' (i.e., the serial data SDATA is 8-bit data), the upper bit data HDATA may be data including the upper three bits of the serial data SDATA and the lower bit data LDATA may be data including the lower five bits of the serial data SDATA, but the disclosure is not limited thereto.

Although FIG. 1A illustrates that the readout circuit 120 is connected to the pixel array 110 in one direction, the readout circuit 120 may be connected to the pixel array 110 in various directions in another embodiment. A plurality of readout circuits 120 may be provided. For example, the plurality of readout circuits 120 may be located in opposite directions while having the pixel array 110 therebetween.

The readout circuit 120 includes an analog-digital converter (ADC) block 121 and a data transfer circuit 123.

The ADC block 121 may convert the analog pixel signals COL1-1 to COLn-m output via the columns of the pixel array 110 into digital pixel signals AD1-1 to ADn-m. For example, the ADC block 121 may convert the analog pixel signals COL1-1 to COLn-m into the digital pixel signals AD1-1 to ADn-m by using single-slope ADCs, respectively.

For example, the ADC block 121 may perform correlated double sampling (CDS) on the analog pixel signals COL1-1 to COLn-m, and generate the digital pixel signals AD1-1 to ADn-m according to a result of performing CDS on the analog pixel signals COL1-1 to COLn-m. Each of the digital pixel signals AD1-1 to ADn-m may be x-bit data. Here, 'x' denotes a natural number.

The data transfer circuit 123 may serialize the digital pixel signals AD1-1 to ADn-m and transmit the serial data SDATA to the AP or the ISP via the serial interface on the basis of a received serial address SADD. For example, the data transfer circuit 123 may process data according to a pipe lining method.

The row decoder 130 may control the plurality of pixels 111 arranged in the directions of rows to be sequentially driven. The row decoder 130 may include a row driver (not shown). The row driver may sequentially drive rows of the pixel array 110 under control of the row decoder 130. For example, the plurality of pixels 111 arranged in the directions of the rows may respectively transmit the analog pixel signals COL1-1 to COLn-m to the columns of the pixel array 110, under control of the row decoder 130.

Figure 1B:
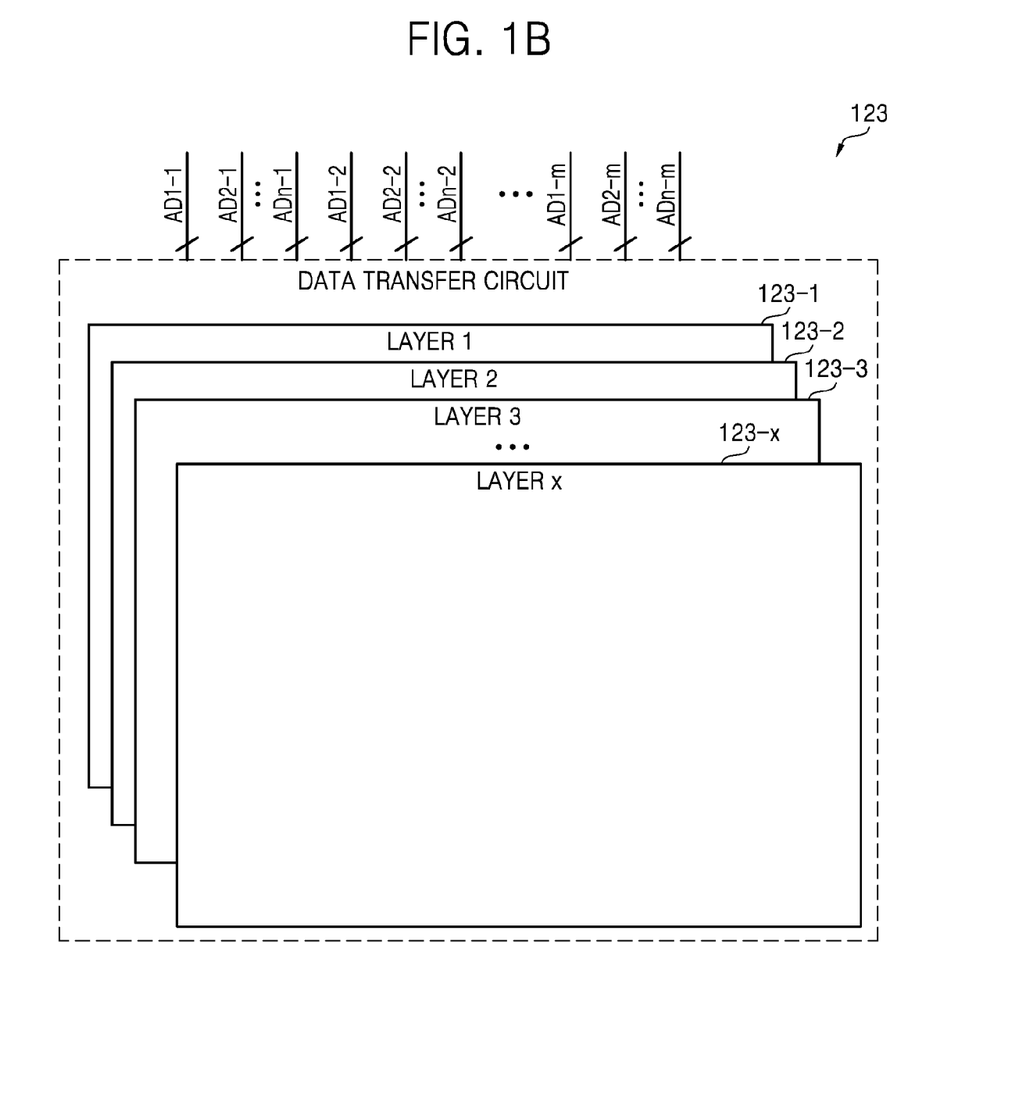
FIG. 1B is a block diagram of a data transfer circuit according to an embodiment of the disclosure.

FIG. 1B is a block diagram of a data transfer circuit 123 according to an embodiment of the disclosure. Referring to FIG. 1B, the data transfer circuit 123 may include a plurality of layers 123-1 to 123-x for transmitting bits of digital pixel signals AD1-1 to ADn-m. Here, 'x' denotes a natural number.

The natural number 'x' may represent the number of the plurality of layers 123-1 to 123-x included in the data transfer circuit 123. As described above, the natural number 'x' may mean the number of the bits of each of the digital pixel signals AD1-1 to ADn-m.

For example, when the digital pixel signals AD1-1 to ADn-m are each 8-bit signals, the data transfer circuit 123 may include eight layers 123-1 to 123-8. The bits of each of the digital pixel signals AD1-1 to ADn-m may be respectively input to the plurality of layers 123-1 to 123-x.

The digital pixel signal AD1-1 will be described as an example below. A first bit of the digital pixel signal AD1-1 may be input to the first layer 123-1. A second bit of the digital pixel signal AD1-1 may be input to the second layer 123-2. An $x^{th}$ bit of the digital pixel signal AD1-1 may be input to the $x^{th}$ layer 123-x. The above description may also apply to the other digital pixel signals AD2-1 to ADn-m.

Figure 2:
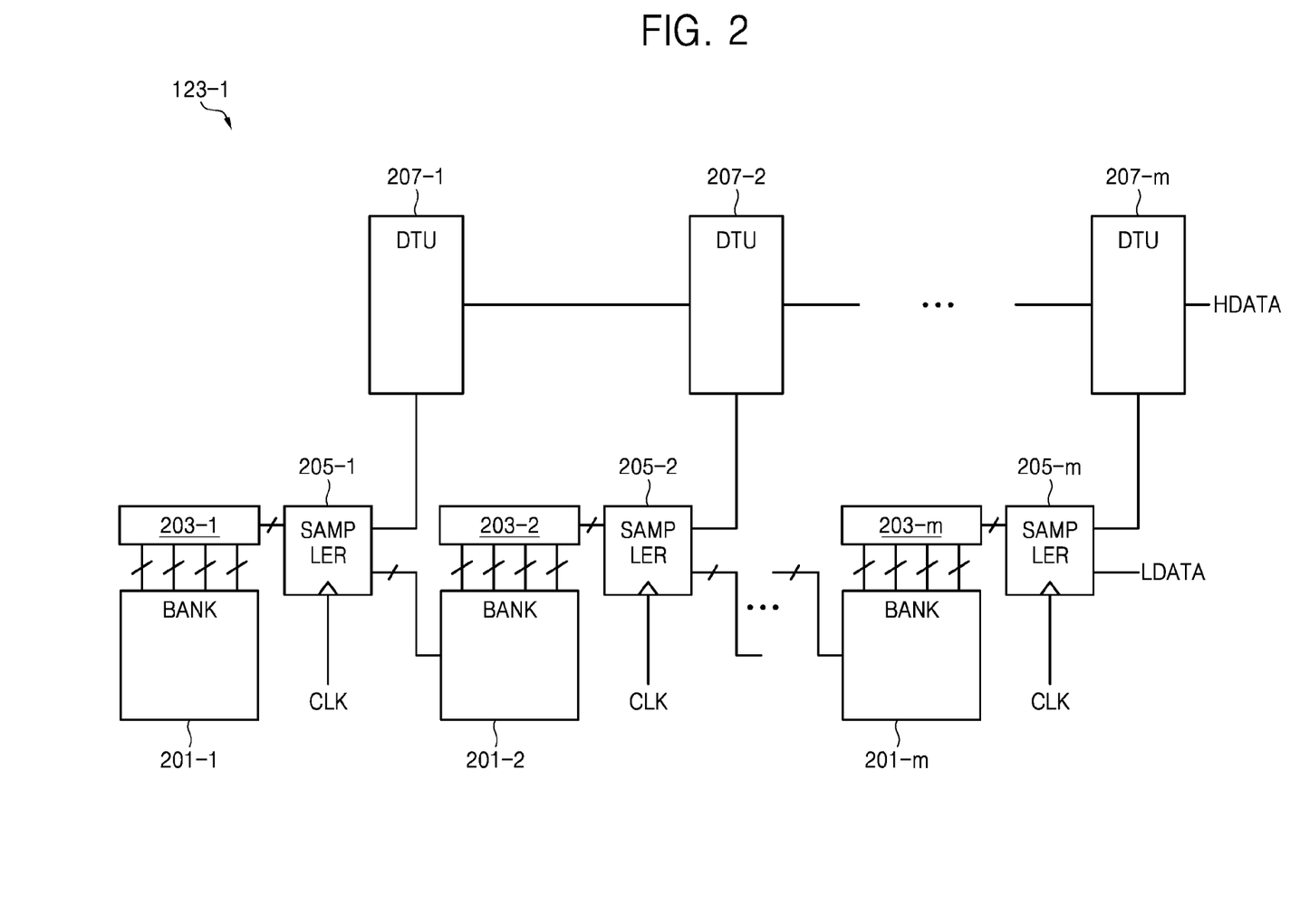
FIG. 2 is a block diagram of a first layer of a data transfer circuit according to an embodiment of the disclosure.

FIG. 2 is a block diagram of the first layer 123-1 of the data transfer circuit 123 according to an embodiment of the disclosure. Although FIG. 2 illustrates only the structure of the first layer 123-1, the other layers 123-2 to 123-x included in the data transfer circuit 123 may have the same structure as the first layer 123-1.

Although only the first layer 123-1 will be described below for convenience of explanation, the other layers 123-2 to 123-x may operate similar to the first layer 123-1. For example, when the digital pixel signals AD1-1 to ADn-m output from the ADC block 121 are 8-bit signals, the data transfer circuit 123 may include a total of eight layers, each of which transmits one bit.

Referring to FIG. 2, the first layer 123-1 of the data transfer circuit 123 may include a plurality of banks 201-1 to 201-m, a plurality of bus units 203-1 to 203-m, a plurality of samplers 205-1 to 205-m, and a plurality of digital transfer units (DTUs) 207-1 to 207-m. Here, 'm' denotes a natural number.

In one embodiment, the number of the plurality of DTUs 207-1 to 207-m may be different from that of the plurality of samplers 205-1 to 205-m. That is, the first DTU 207-1 may be omitted unlike that illustrated in FIG. 2.

The plurality of banks 201-1 to 201-m may respectively supply a plurality of analog voltage signals AVS-1 to AVS-m to the plurality of bus units 203-1 to 203-m, based on either first bits of each of the digital pixel signals AD1-1 to ADn-m received from the ADC block 121 or a plurality of digital transmission signals DTS-1 to DTS-(m−1) received from the plurality of samplers 205-1 to 205-(m−1), as will be described in detail with reference to FIGS. 3 to 5 below.

The analog voltage signals AVS-1 to AVS-m may be small-swing signals, voltage signals, or differential signals.

The plurality of bus units 203-1 to 203-m may respectively include transmission lines, e.g., metals, for respectively transmitting the analog voltage signals AVS-1 to AVS-m. For example, the first bank 201-1 may supply the first analog voltage signal AVS-1 to the transmission line included in the first bus unit 203-1.

The plurality of samplers 205-1 to 205-m may respectively receive the plurality of analog voltage signal AVS-1 to AVS-m allocated to the plurality of bus units 203-1 to 203-m. For example, the first sampler 205-1 may receive the analog voltage signal AVS-1 allocated to the transmission line included in the first bus unit 203-1.

The plurality of samplers 205-1 to 205-m may respectively convert the plurality of analog voltage signals AVS-1 to AVS-m into a plurality of digital transmission signals DTS-1 to DTS-m.

The plurality of digital transmission signals DTS-1 to DTS-m may be full-swing signals, voltage signals, or differential signals. For example, the plurality of samplers 205-1 to 205-m may include latches, strong arm latch comparators, or flip-flops which are operated according to a clock signal CLK.

As described above, swing widths of the plurality of analog voltage signals AVS-1 to AVS-m input to the plurality of samplers 205-1 to 205-m may be different from those of the plurality of digital transmission signals DTS-1 to DTS-m which are output signals. For example, each of the plurality of analog voltage signal AVS-1 to AVS-m which are input signals may be a small-swing signal, and each of the plurality of digital transmission signals DTS-1 to DTS-m which are output signals may be a full-swing signal.

In one embodiment, the plurality of samplers 205-1 to 205-$m$ may transmit signals in a uni-direction. In another embodiment, the plurality of samplers 205-1 to 205-$m$ may transmit signals in bi-directions. In this case, each of the plurality of samplers 205-1 to 205-$m$ may have a function of processing an input signal.

(a) A case in which the first layer 123-1 of the data transfer circuit 123 of FIG. 2 is a layer for transmitting upper bits, and (b) a case in which the first layer 123-1 of the data transfer circuit 123 of FIG. 2 is a layer for transmitting lower bits will be described below.

(a) The case in which the first layer 123-1 of the data transfer circuit 123 of FIG. 2 is a layer for transmitting upper bits: The plurality of samplers 205-1 to 205-$m$ may respectively transmit the plurality of digital transmission signals DTS-1 to DTS-m to the plurality of DTUs 207-1 to 207-$m$. For example, the first sampler 205-1 may transmit the first digital transmission signal DTS-1 to the first DTU 207-1.

In other words, if the first layer 123-1 of the data transfer circuit 123 of FIG. 2 is a layer for transmitting upper bits, the first layer may transmit upper bits using a first transmission method.

The first transmission method is a method of sequentially transmitting upper bits to the application processor by the first layer via the plurality of DTUs 207-1 to 207-$m$ connected in series.

Although FIG. 2 illustrates that the plurality of samplers 205-1 to 205-$m$ transmit the plurality of digital transmission signals DTS-1 to DTS-m in the form of single-phase signals, the disclosure is not limited thereto and the plurality of samplers 205-1 to 205-$m$ may transmit the plurality of digital transmission signals DTS-1 to DTS-m in the form of differential signals.

The plurality of DTUs 207-1 to 207-$m$ may respectively receive the plurality of digital transmission signals DTS-1 to DTS-m transmitted from the plurality of samplers 205-1 to 205-$m$. For example, the first DTU 207-1 may receive the first digital transmission signal DTS-1 from the first sampler 205-1, and the second DTU 207-2 may receive the second digital transmission signal DTS-2 from the second sampler 205-2.

Also, the DTUs 207-2 to 207-$m$ may respectively receive signals transmitted from the plurality of DTUs 207-1 to 207-($m$-1). For example, the second DTU 207-2 may receive a signal transmitted from the first DTU 207-1.

The plurality of DTUs 207-1 to 207-($m$-1) may each select one of the received signals and may sequentially transmit the selected signals to the plurality of DTUs 207-2 to 207-$m$. The first DTU 207-1 may transmit the received first digital transmission signal DTS-1 to the second DTU 207-2.

The $m^{th}$ DTU 207-$m$ may sequentially receive the signal transmitted from the $(m-1)^{th}$ DTU 207-($m$-1) and the $m^{th}$ digital transmission signal DTS-m from the $m^{th}$ sampler 205-$m$.

As described above, the plurality of DTUs 207-1 to 207-($m$-1) may each select one of the received signals and may sequentially transmit the selected signals to the next DTU. Thus, the first digital transmission signal DTS-1 output from the first sampler 205-1 may be transmitted to the $m^{th}$ DTU 207-$m$.

The $m^{th}$ DTU 207-$m$ may select one of the received signals and transmit the selected signal to an AP or an ISP.

In this case, the selected signal transmitted from the $m^{th}$ DTU 207-$m$ to the AP or the ISP may be upper bit data HDATA.

As described above, the first layer 123-1 of the data transfer circuit 123 may consume less power by transmitting the upper bits through the plurality of DTUs 207-1 to 207-$m$, than the other layer for transmitting the upper bits through the plurality of banks 201-1 to 201-$m$ and the plurality of samplers 205-1 to 205-$m$, because the upper bits of general image data are rarely changed.

Furthermore, the plurality of banks 201-2 to 201-$m$ and the plurality of samplers 205-2 to 205-$m$ included in the first layer 123-1 of the data transfer circuit 123, may not need to be powered on for transmitting data from the first bank 201-1, therefore the first layer 123-1 of the data transfer circuit 123 may consume less power.

(b) The case in which the first layer 123-1 of the data transfer circuit 123 of FIG. 2 is a layer for transmitting lower bits: According to an embodiment, the plurality of samplers 205-1 to 205-($m$-1) may transmit the plurality of digital transmission signals DTS-1 to DTS-($m$-1) to the plurality of banks 201-2 to 201-$m$.

In other words, if the first layer 123-1 of the data transfer circuit 123 of FIG. 2 is a layer for transmitting lower bits, the first layer may transmit lower bits using a second transmission method.

The second transmission method is a method of sequentially transmitting lower bits to the application processor by the first layer via the plurality of banks 201-1 to 201-$m$ and the plurality of samplers 205-1 to 205-$m$.

The plurality of banks 201-2 to 201-$m$ may operate as described above.

The $m^{th}$ sampler 205-$m$ may transmit the $m^{th}$ digital transmission signal DTS-m to the AP or the ISP. In this case, the $m^{th}$ digital transmission signal DTS-m transmitted from the $m^{th}$ sampler 205-$m$ to the AP or the ISP may be lower bit data LDATA.

In this case, the plurality of samplers 205-1 to 205-$m$ may transmit the plurality of digital transmission signals DTS-1 to DTS-m in the form of differential signals but the disclosure is not limited thereto.

According to an embodiment, the data transfer circuit 123 having the plurality of layers 123-1 to 123-$x$ may transmit upper bits and lower bits of each of the plurality of digital pixel signals AD1-1 to ADn-m to the AP or the ISP in different paths. For example, when each of the plurality of digital pixel signals AD1-1 to ADn-m is 8 bits long, the data transfer circuit 123 may connect three upper bits of each of the plurality of digital pixel signals AD1-1 to ADn-m to three layers and transmit the three upper bits to the AP or the ISP by using the plurality of DTUs 207-1 to 207-$m$ of FIG. 2.

Also, the data transfer circuit 123 may connect five lower bits of each of the plurality of digital pixel signals AD1-1 to ADn-m to five layers and transmit the five lower bits to the AP or the ISP by using the plurality of banks 201-1 to 201-$m$ and the plurality of samplers 205-1 to 205-$m$ illustrated in FIG. 2.

The disclosure is, however, not limited thereto, and the number of the bits of each of the plurality of digital pixel signals AD1-1 to ADn-m and the ratio between upper and lower bits thereof may be changed.

Figure 3:
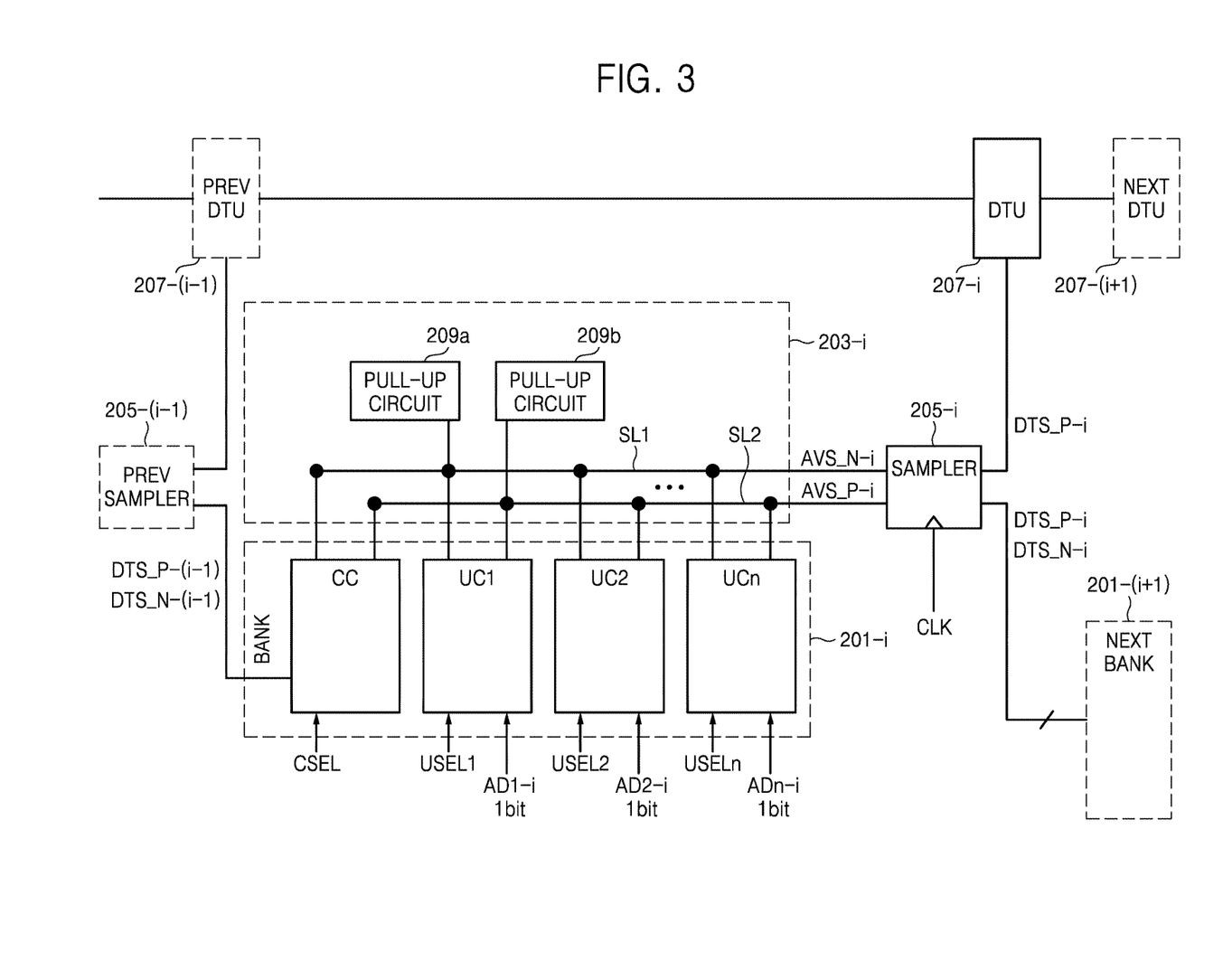
FIG. 3 is a detailed block diagram of a portion of the first layer of the data transfer circuit of FIG. 2.

FIG. 3 is a detailed block diagram of a portion of the first layer 123-1 of the data transfer circuit 123 of FIG. 1. It is assumed that the portion of the first layer 123-1 of the data transfer circuit 123 illustrated in FIG. 3 includes an $i^{th}$ bank 201-$i$, an $i^{th}$ bus unit 203-$i$, and an $i^{th}$ sampler 205-$i$. Here, 'i' denotes a natural number ranging from 2 to (m−1).

Referring to FIG. 3, the $i^{th}$ bank 201-$i$ may include a connection cell CC and a plurality of units cells UC1 to UCn.

The connection cell CC may receive an (i−1)$^{th}$ digital transmission signal DTS-(i−1) from an (i−1)$^{th}$ previous sampler 201-(i−1). In this case, the (i−1)$^{th}$ digital transmission signal DTS-(i−1) may be a differential signal and include an (i−1)$^{th}$ positive digital transmission signal DTS_P-(i−1) and an (i−1)$^{th}$ negative digital transmission signal DTS_N-(i−1). The connection cell CC may receive a connection selection signal CSEL.

The plurality of unit cells UC1 to UCn may respectively receive first bits of a plurality of respective digital pixel signals AD1-$i$ to ADn-$i$. In this case, the first bits of the plurality of respective digital pixel signals AD1-$i$ to ADn-$i$ may be single-phase signals.

The plurality of unit cells UC1 to UCn may respectively receive a plurality of unit selection signals USEL1 to USELn. When the selection signals CSEL and USEL1 to USELn are sequentially input to the connection cell CC and the plurality of unit cells UC1 to UCn, the connection cell CC and the plurality of unit cells UC1 to UCn may be sequentially activated.

Thus, each of the plurality of cells including the connection cell CC and the plurality of unit cells UC1 to UCn may apply an $i^{th}$ analog voltage signal AVS-$i$ to the $i^{th}$ bus unit 203-$i$, based on one of the received signals. For example, when the n$^{th}$ unit cell UCn is first activated, the n$^{th}$ unit cell UCn may apply a voltage to the $i^{th}$ bus unit 203-$i$ on the basis of the first bit of the digital pixel signal ADn-$i$.

When the first unit cell UC1 is activated, the first unit cell UC1 may apply a voltage to the $i^{th}$ bus unit 203-$i$ on the basis of the first bit of the digital pixel signal AD1-$i$.

Lastly, when the connection cell CC is activated, the connection cell CC may apply a voltage to the $i^{th}$ bus unit 203-$i$ on the basis of the digital transmission signal DTS-(i−1).

As described above, the voltages sequentially applied to the plurality of cells CC and UC1 to UCn may be each the $i^{th}$ analog voltage signal AVS-$i$.

The $i^{th}$ bus unit 203-$i$ may include a first signal line SL1, a second signal line SL2, a first pull-up circuit 209$a$, and a second pull-up circuit 209$b$. The first signal line SL1 and the second signal line SL2 included in the $i^{th}$ bus unit 203-$i$ may connect the plurality of cells CC and UC1 to UCn to the $i^{th}$ sampler 205-$i$.

The first signal line SL1 and the second signal line SL2 included in the $i^{th}$ bus unit 203-$i$ may transmit the $i^{th}$ analog voltage signal AVS-$i$ allocated by the $i^{th}$ bank 201-$i$ to the $i^{th}$ sampler 205-$i$. In this case, the $i^{th}$ analog voltage signal AVS-$i$ may be a differential signal, and include an $i^{th}$ positive analog voltage signal AVS_P-$i$ and an $i^{th}$ negative digital transmission signal AVS_N-$i$.

For example, the $i^{th}$ negative digital transmission signal AVS_N-$i$ may be allocated to the first signal line SL1 and the $i^{th}$ positive analog voltage signal AVS_P-$i$ may be allocated to the second signal line SL2, but the disclosure is not limited thereto.

The first pull-up circuit 209$a$ may be connected to the first signal line SL1. The second pull-up circuit 209$b$ may be connected to the second signal line SL2. The first pull-up circuit 209$a$ may pull up the first signal line SL1. The second pull-up circuit 209$b$ may pull up the second signal line SL2.

The first and second pull-up circuits 209 and 209$b$ may each output a pull-up voltage, e.g., a power supply voltage.

In one embodiment, the pull-up voltages output from the first and second pull-up circuits 209$a$ and 209$b$ may be the same or different from each other.

The $i^{th}$ sampler 205-$i$ may receive the $i^{th}$ negative digital transmission signal AVS_N-$i$ from the first signal line SL1 and the $i^{th}$ positive analog voltage signal AVS_P-$i$ from the second signal line SL2.

The $i^{th}$ sampler 205-$i$ may convert the $i^{th}$ analog voltage signal AVS-$i$ into an $i^{th}$ digital transmission signal DTS-$i$. In this case, the $i^{th}$ digital transmission signal DTS-$i$ may be a differential signal and include an $i^{th}$ positive digital transmission signal DTS_P-$i$ and an $i^{th}$ negative digital transmission signal DTS_N-$i$.

As described above, when the first layer 123-1 of the data transfer circuit 123-$i$ illustrated in FIG. 3 is a layer for transmitting upper bits, the $i^{th}$ sampler 205-$i$ may transmit the $i^{th}$ positive digital transmission signal DTS_P-$i$ to an $i^{th}$ DTU 207-$i$.

The $i^{th}$ DTU 207-$i$ may select a positive digital transmission signal DTS_P' received from a previous (i−1)$^{th}$ DTU 207-(i−1) or the $i^{th}$ positive digital transmission signal DTS_P-$i$ received from the $i^{th}$ sampler 205-$i$, and output the selected signal to a next (i+1)$^{th}$ DTU 207-(i+1).

In contrast, when the first layer 123-1 of the data transfer circuit 123-$i$ illustrated in FIG. 3 is a layer for transmitting lower bits, the $i^{th}$ sampler 205-$i$ may transmit the $i^{th}$ digital transmission signal DTS-$i$ to the next (i+1)$^{th}$ bank 201-(i+1) using both DTS_P-$i$ and DTS_N-$i$.

When the portion of the first layer 123-1 of the data transfer circuit 123 described above includes a first bank 201-1, a first bus unit 203-1, and a first sampler 205-1, the (i−1)$^{th}$ sampler 205-(i−1), the (i−1)$^{th}$ DTU 207-(i−1), and the connection cell CC illustrated in FIG. 3 may be omitted or may be blocks which do not functionally operate. Operations of the other blocks are as described above.

When the portion of the first layer 123-1 of the data transfer circuit 123 described above includes an m$^{th}$ bank 201-$m$, an m$^{th}$ bus unit 203-$m$, and an m$^{th}$ sampler 205-$m$, the (i+1)$^{th}$ sampler 205-(i+1) and the (i+1)$^{th}$ DTU 207-(i+1) illustrated in FIG. 3 may be omitted or may be blocks which do not functionally operate. Operations of the other blocks are as described above.

As described above, when the first layer 123-1 of the data transfer circuit 123 illustrated in FIG. 3 is a layer for transmitting upper bits, the $i^{th}$ DTU 207-$i$ may transmit upper bit data HDATA to the AP or the ISP.

When the first layer 123-1 of the data transfer circuit 123 illustrated in FIG. 3 is a layer for transmitting lower bits, the $i^{th}$ sampler 205-$i$ may transmit lower bit data LDATA to the AP or the ISP.

Figure 4:
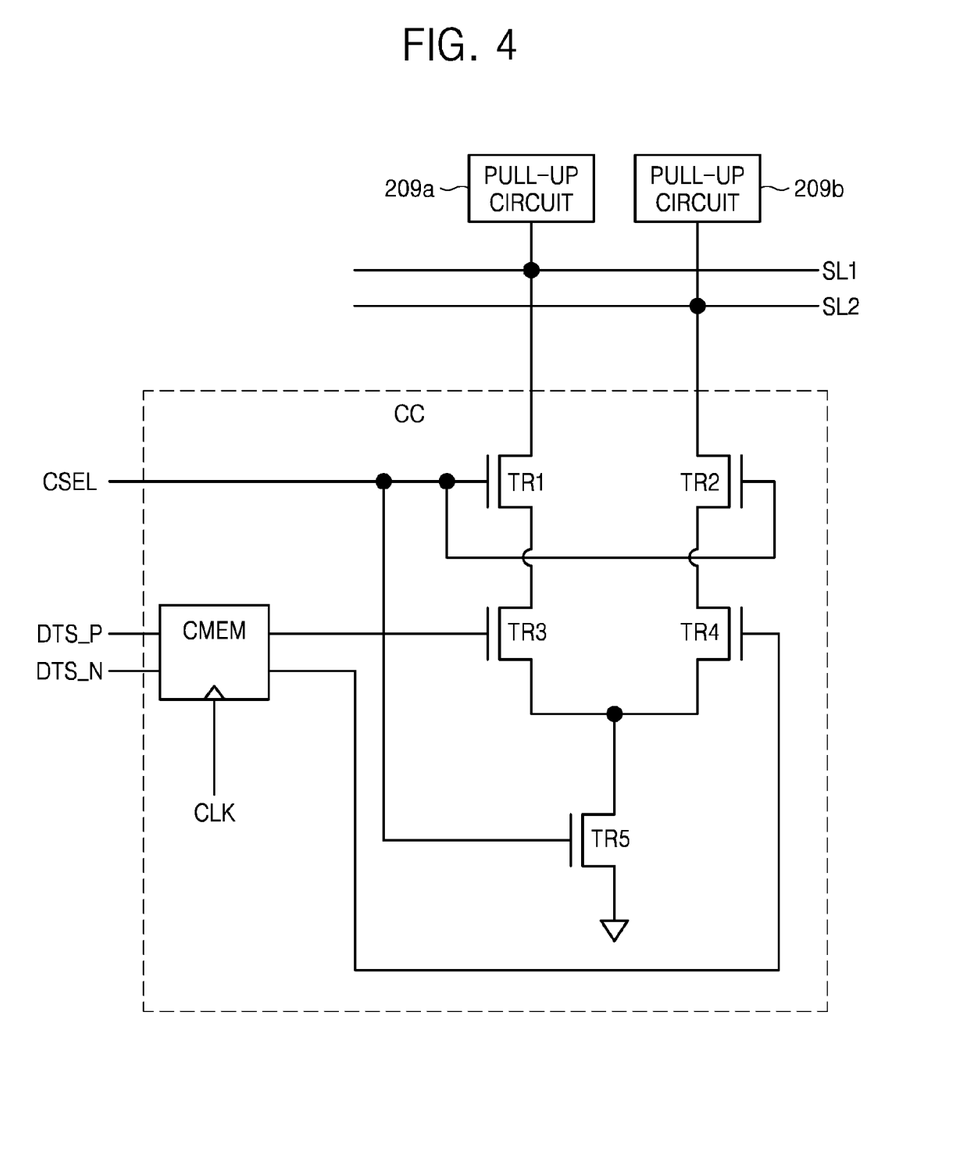
FIG. 4 is a detailed circuit diagram of a connection cell according to an embodiment of the disclosure.

FIG. 4 is a detailed circuit diagram of a connection cell CC according to an embodiment of the disclosure. Referring to FIG. 4, the connection cell CC may include a connection memory CMEM and a plurality of transistors TR1 to TR5.

Although FIG. 4 illustrates a case in which the plurality of transistors TR1 to TR5 is five transistors, the disclosure is not limited thereto.

The connection memory CMEM may be embodied as a latch or a flip-flop.

The plurality of transistors TR1 to TR5 may be each a MOS transistor. Each of the transistors TR1, TR2, and TR5 may connect a first signal line SL1 and a second signal line SL2 (in other words, a bus unit 203-$i$ of FIG. 3) to ground according to a connection selection signal CSEL.

The connection memory CMEM may receive a digital transmission signal DTS, e.g., a positive digital transmission signal DTS_P and a negative digital transmission signal DTS_N. The connection memory CMEM may store the positive digital transmission signal DTS_P and the negative digital transmission signal DTS_N, and transmit the positive digital transmission signal DTS_P to the third transistor TR3 and the negative digital transmission signal DTS_N to the fourth transistor TR4, according to a clock signal CLK. For example, when the positive digital transmission signal DTS_P is '1', the third transistor TR3 may be enabled and the fourth transistor TR4 may be disabled.

The connection selection signal CSEL may be transmitted to the first transistor TR1, the second transistor TR2, and the fifth transistor TR5 on the basis of a serial address SADD output from an AP (not shown). For example, when the connection selection signal CSEL is '1', the connection cell CC may be activated. In this case, the connection cell CC may respectively apply voltages to a first signal line SL1 and a second signal line SL2 according to operations of the plurality of transistors TR1 to TR5.

For example, when the connection selection signal CSEL is '1' and the positive digital transmission signal DTS_P is '1', a first pull-up circuit 209a may be connected to the ground. In this case, a comparison voltage may be applied to the first signal line SL1 according to values of internal resistors of the plurality of transistors TR1 to TR5 and an internal resistance value of the first pull-up transistor 209a. Since the negative digital transmission signal DTS_N is '0', a pull-up voltage of the second pull-up circuit 209b may be applied to the second signal line SL2.

The pull-up voltage may be, for example, a power supply voltage or driving voltage Vdd. The comparison voltage is a value which is set during the design of a data transfer circuit, and may be lower than the power supply voltage but the disclosure is not limited thereto.

That is, when the connection cell CC is activated, signal levels of the respective first and second signal lines SL1 and SL2 may be determined according to the digital transmission signal DTS.

Figure 5:
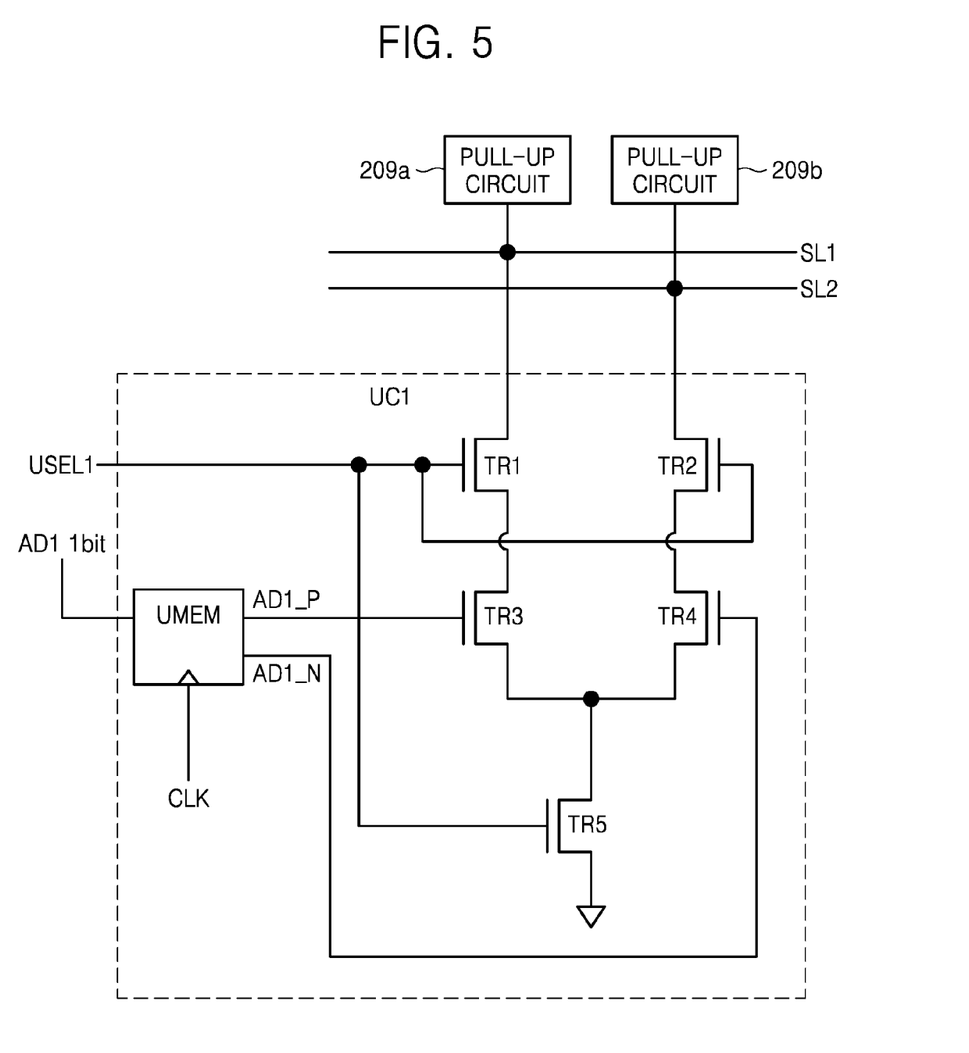
FIG. 5 is a detailed circuit diagram of a first connection cell according to an embodiment of the disclosure.

FIG. 5 is a detailed circuit diagram of a first connection cell UC1 according to an embodiment of the disclosure. FIG. 5 exemplarily illustrates the first unit cell UC1 illustrated in FIG. 3 but the disclosure may also apply to the other plurality of unit cells UC2 to UCn of FIG. 3.

Referring to FIG. 5, the first unit cell UC1 may include a unit memory UMEM and a plurality of transistors TR1 to TR5.

Although FIG. 5 illustrates the plurality of transistors TR1 to TR5 as five transistors, the disclosure is not limited thereto.

The unit memory UMEM may be embodied as a latch or a flip-flop.

Each of the plurality of transistors TR1 to TR5 may be a MOS transistor. Each of the transistors TR1, TR2, and TR5 may connect a first signal line SL1 and a second signal line SL2 (in other words, a bus unit 203-i) to ground according to a first unit selection signal CSEL1.

The unit memory UMEM may receive a first bit of a digital pixel signal AD1. The unit memory UMEM may store the first bit of the digital pixel signal AD1 and transmit a positive digital pixel signal AD1_P to the third transistor TR3 and a negative digital pixel signal AD to the fourth transistor TR4, according to a clock signal CLK. For example, when the positive digital pixel signal AD1_P is '1', the third transistor TR3 may be enabled and the fourth transistor TR4 may be disabled.

A first unit selection signal USEL1 may be output to the first transistor TR1, the second transistor TR2, and the fifth transistor TR5 on the basis of a serial address SADD output from an AP (not shown). For example, when the first unit selection signal USEL1 is '1', the first unit cell UC1 may be activated. In this case, the first unit cell UC1 may apply voltages to a first signal line SL1 and a second signal line SL2 according to operations of the plurality of transistors TR1 to TR5.

For example, when the first unit selection signal USEL1 is '1' and a first bit of the positive digital pixel signal AD1_P is '1', a first pull-up circuit 209a may be connected to ground. In this case, a comparison voltage may be applied to the first signal line SL1 according to values of internal resistors of the plurality of transistors TR1 to TR5 and an internal resistance value of the first pull-up circuit 209a. Also, since a first bit of the negative digital pixel signal AD1_N is '0', a pull-up voltage of a second pull-up circuit 209b may be applied to the second signal line SL2.

That is, when the first connection cell UC1 is activated, signal levels of the respective first and second signal lines SL1 and SL2 may be determined according to the first bit of the digital pixel signal AD1.

Figure 6:
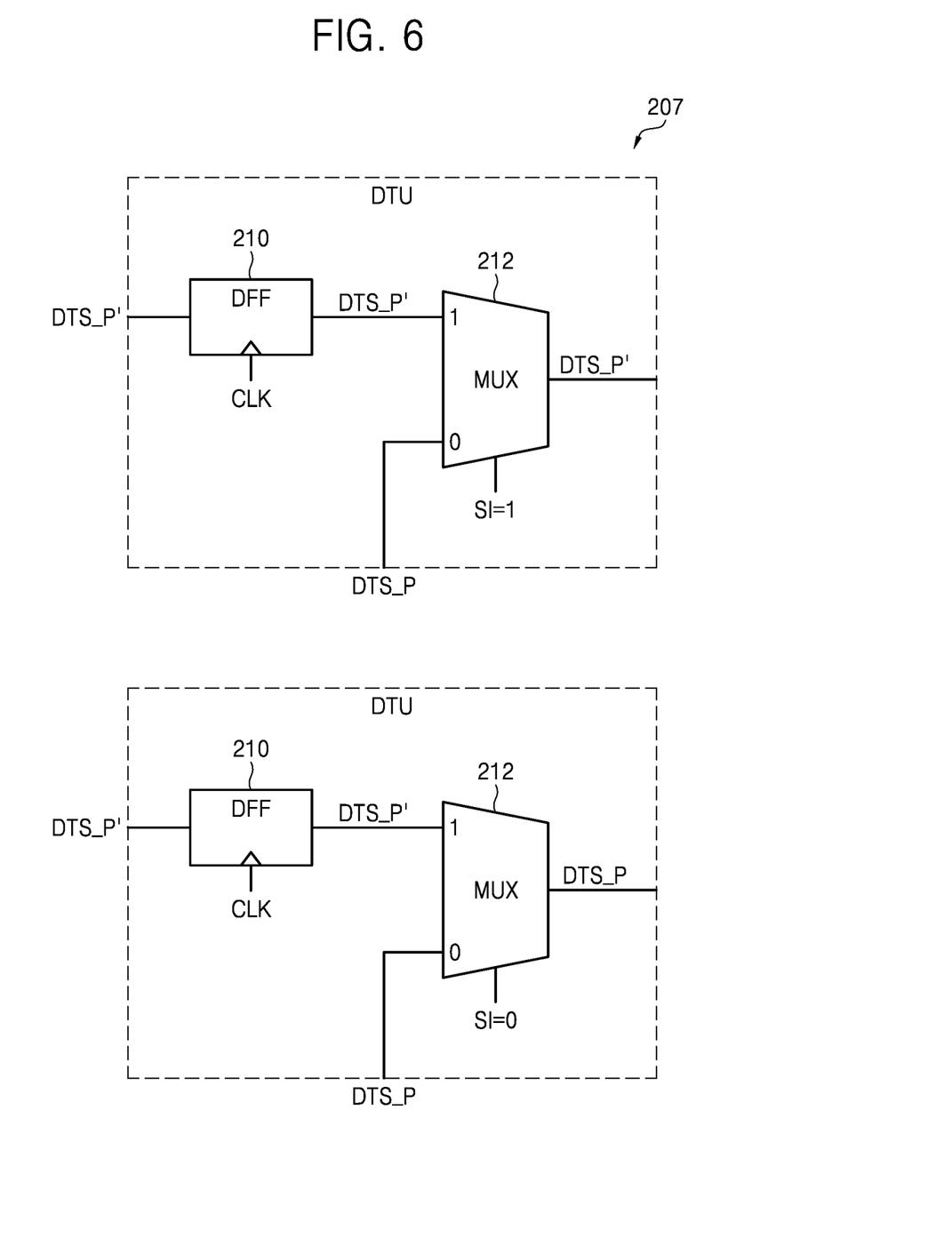
FIG. 6 is a detailed block diagram of a digital transfer unit according to an embodiment of the disclosure.

FIG. 6 is a detailed block diagram of a digital transfer unit (DTU) 207 according to an embodiment of the disclosure. Referring to FIG. 6, the DTU 207 may include a D-flip-flop (DFF) 210 and a multiplexer (MUX) 212.

The DFF 210 may be embodied as a flip-flop.

The DFF 210 may receive a previous positive digital transmission signal DTS_P' from a previous DTU (not shown). The DFF 210 may store the previous positive digital transmission signal DTS_P' and transmit it to the MUX 212, according to a clock signal CLK.

The MUX 212 may receive the previous positive digital transmission signal DTS_P' from the DFF 210 and receive a current positive digital transmission signal DTS_P from a sampler (not shown). The MUX 212 may select the previous positive digital transmission signal DTS_P' or the current positive digital transmission signal DTS_P and output the selected signal to a next DTU (not shown), according to selection information SI.

FIG. 6 illustrates an operation of the DTU 207 according to the selection information SI.

In the DTU 207 illustrated in an upper part of FIG. 6, since the selection information SI is '1', the MUX 212 may output the previous positive digital transmission signal DTS_P' to the next DTU.

In the DTU 207 illustrated in a lower part of FIG. 6, since the selection information SI is '0', the MUX 212 may output the current positive digital transmission signal DTS_P to the next DTU.

Figure 7:
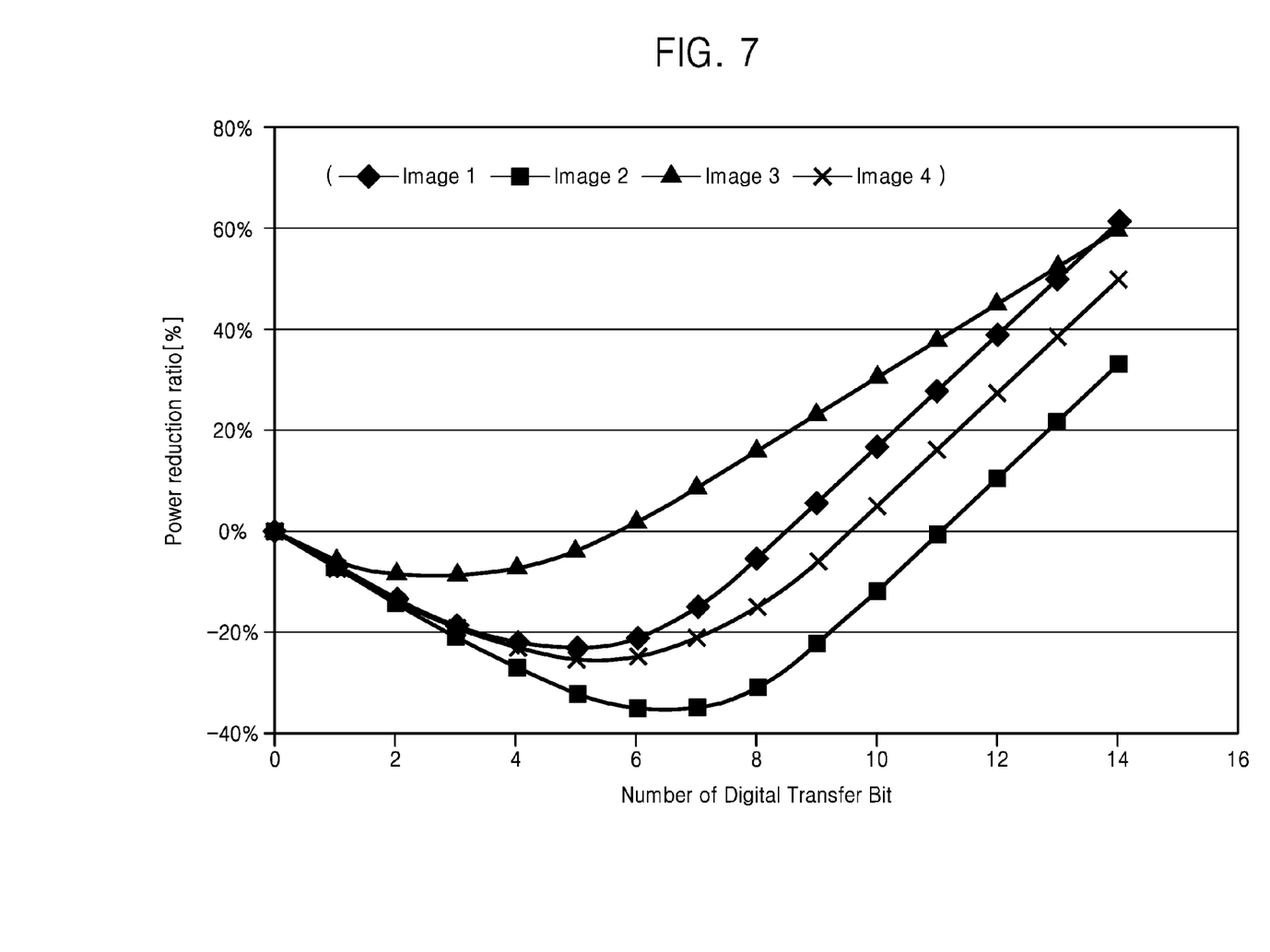
FIG. 7 is a graph showing a change in a power consumption rate of a data transfer circuit according to the number of upper bits, according to an embodiment of the disclosure.

FIG. 7 is a graph showing a change in a power consumption rate of a data transfer circuit according to the number of upper bits, according to an embodiment of the disclosure. Referring to FIG. 7, the vertical axis of the graph represents a change in the power consumption rate of the data transfer circuit, and the horizontal axis of the graph represents the number of bits transmitted according to a digital transmission method.

Here, 'image 1' may represent a reference image. For example, the image 1 may represent an image of a table on which sundries are put. For example, 'image 2' may be an image of a box in which wine bottles are put. For example, 'image 3' may represent an image of a view of a general riverside. For example, 'image 4' may represent an image of a surface of a wall covered with various plants.

Referring to the graph of FIG. 7, when the number of upper bits transmitted according to the digital transmission method is '3', the power consumption rate of the data transfer circuit decreases by 8 to 21 percent.

When the number of upper bits transmitted according to the digital transmission method is '3' to '7', the power consumption rate of the data transfer circuit decreases to a maximum degree. When the number of upper bits transmitted according to the digital transmission method is '8' or more, the power consumption rate of the data transfer circuit increases.

Figure 8:
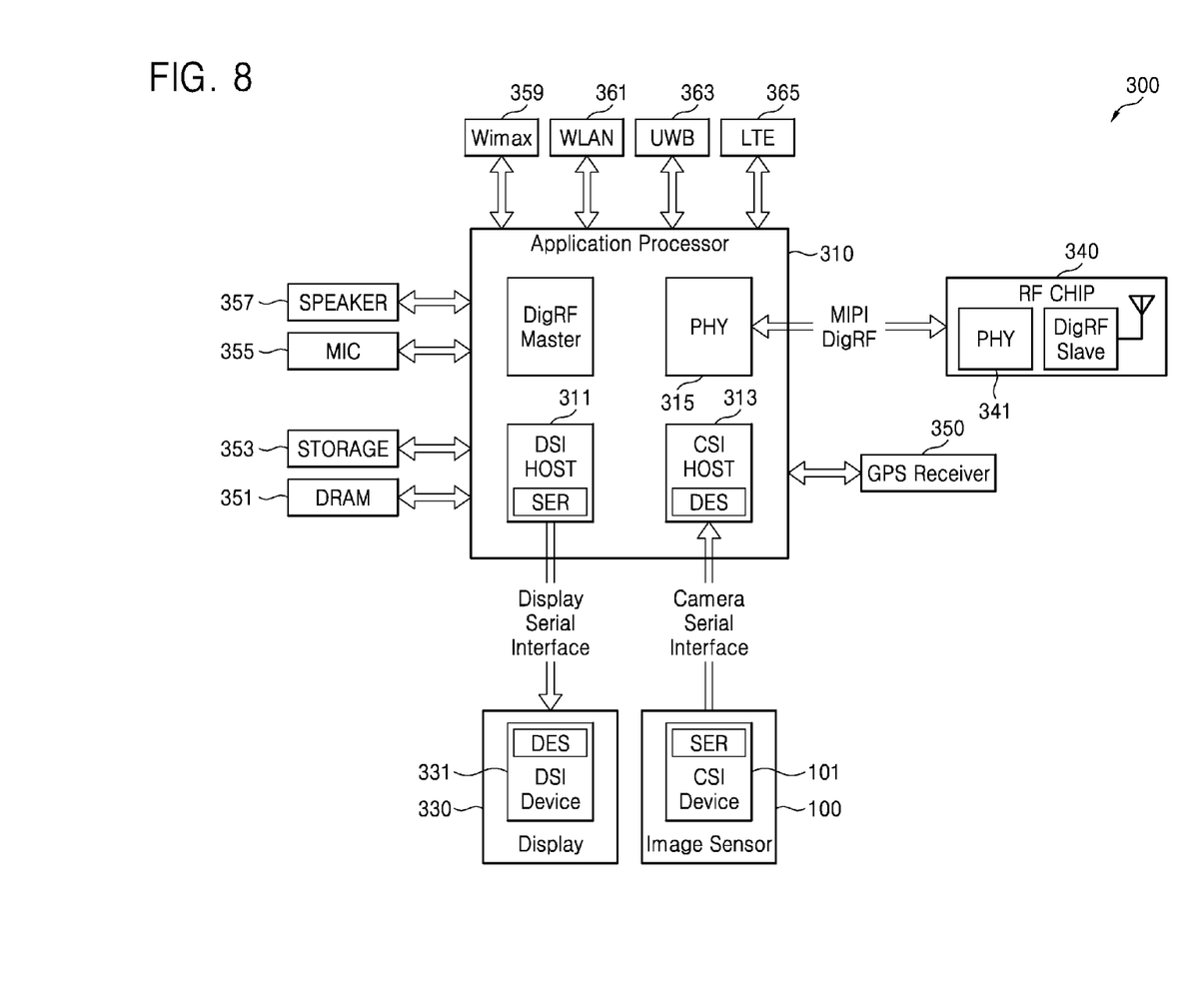
FIG. 8 is a block diagram of an electronic device including an image sensor according to some embodiments of the disclosure.

FIG. 8 is a block diagram of an electronic device including an image sensor according to some embodiments of the disclosure. The electronic device 300 may be implemented by a portable electronic apparatus, such as a mobile phone, a personal digital assistant (PDA), a portable media player (PMP), or a smart phone that can use or support an MIPI interface. The electronic device 300 includes an application processor 310, the image sensor 100, and a display 330.

A camera serial interface (CSI) host 313 included in the application processor 310 performs serial communication with a CSI device 101 included in the image sensor 100 through CSI. For example, an optical de-serializer (DES) may be implemented in the CSI host 313, and an optical serializer (SER) may be implemented in the CSI device 101.

The structure and operation of the image sensor 100 are the same as described with reference to FIGS. 1 through 8.

A display serial interface (DSI) host 311 included in the application processor 310 performs serial communication with a DSI device 331 included in the display 330 through DSI. For example, an optical serializer may be implemented in the DSI host 311, and an optical de-serializer may be implemented in the DSI device 331.

The electronic device 300 may also include a radio frequency (RF) chip 340 which communicates with the application processor 310. A physical layer (PHY) 315 of the electronic device 300 and a PHY 341 of the RF chip 340 communicate data with each other according to an MIPI® DigRF standard.

The electronic device 300 may further include a GPS receiver 350, a DRAM 351, a storage device 353, a microphone 355, and a speaker 357. The electronic device 300 may communicate using Wimax (World Interoperability for Microwave Access) 359, WLAN (Wireless LAN) 361, UWB (Ultra Wideband) 363 or LTE (Long-Term Evolution) 365 etc.

In a data transfer circuit according to an embodiment of the disclosure, a digital transmission method is used to transmit upper bits and an analog transmission method is used to transmit lower bits. Accordingly, a power consumption rate of a data transfer circuit when an image is transmitted may decrease.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to the exemplary embodiments illustrated in the drawings, these exemplary embodiments are merely examples. It would be obvious to those of ordinary skill in the art that these exemplary embodiments are to cover all modifications, equivalents, and alternatives falling within the scope of the disclosure. Accordingly, the technical scope of the disclosure should be defined based on the technical idea of the appended claims.

What is claimed is:

1. A data transfer circuit comprising:
   a first layer configured to transmit first bits; and
   a second layer configured to transmit second bits, wherein:
   each of the first layer and the second layer comprises:
      first to $m^{th}$ banks configured to convert a plurality of received digital pixel signals into first to $m^{th}$ analog voltage signals, wherein 'm' denotes an integer which is greater than or equal to '2';
      first to $m^{th}$ samplers configured to convert the first to $m^{th}$ analog voltage signals into first to $m^{th}$ digital transmission signals; and
      first to $m^{th}$ digital transfer units configured to respectively receive the first to $m^{th}$ digital transmission signals.

2. The data transfer circuit of claim 1, further comprising first to $m^{th}$ bus units configured to receive the first to $m^{th}$ analog voltage signals from the first to $m^{th}$ banks and transmit the first to $m^{th}$ analog voltage signals to the first to $m^{th}$ samplers.

3. The data transfer circuit of claim 2, wherein the first to $m^{th}$ samplers are respectively connected to the first to $m^{th}$ digital transfer units.

4. The data transfer circuit of claim 3, wherein:
   the first to $(m-1)^{th}$ samplers are respectively connected to the second to $m^{th}$ banks, and
   the $m^{th}$ sampler is connected to an application processor.

5. The data transfer circuit of claim 4, wherein:
   the first to $m^{th}$ digital transfer units are connected in series to each other so as to transmit signals, and
   the $m^{th}$ digital transfer unit is connected to the application processor.

6. The data transfer circuit of claim 5, wherein the first to $m^{th}$ samplers of the first layer respectively transmit the first to $m^{th}$ digital transmission signals to the first to $m^{th}$ digital transfer units.

7. The data transfer circuit of claim 6, wherein the first to $(m-1)^{th}$ samplers of the second layer respectively transmit the first to $(m-1)^{th}$ digital transmission signals to the second to $m^{th}$ banks.

8. The data transfer circuit of claim 7, wherein:
   the first bits are upper bits, and the second bits are lower bits,
   a ratio of the first bits to the second bits is variable.

9. The data transfer circuit of claim 2, wherein each of the first to $m^{th}$ data transmission units comprises:
   a D-flip-flop; and
   a multiplexer connected to a corresponding sampler among the second to $m^{th}$ samplers and the D-flip-flop.

10. The data transfer circuit of claim 9, wherein:
    the D-flip-flop is a synchronization circuit operating according to a clock signal, and the multiplexer outputs one of input signals on a basis of selection information.

11. An image sensor comprising:
a pixel array including a plurality of pixels; and
a readout block configured to receive a plurality of analog pixel signals from the pixel array, wherein:
the readout block comprises:
   an analog-digital converter block configured to convert the plurality of analog pixel signals into a plurality of digital pixel signals; and
   a data transfer circuit configured to serialize the plurality of digital pixel signals and transmit the serialized plurality of digital pixel signals to an application processor,
the data transfer circuit comprises a first layer and a second layer,
the first layer transmits first bits of each of the serialized plurality of digital pixel signals to the application processor by using a first transmission method,
the second layer transmits second bits of each of the serialized plurality of digital pixel signals to the application processor by using a second transmission method,
the first bits are upper bits and the second bits are lower bits, and
a ratio of the first bits to the second bits is variable.

12. The image sensor of claim 11, wherein the first transmission method is a method of sequentially transmitting the first bits of each of the serialized plurality of digital pixel signals to the application processor by the first layer via first to $M^{th}$ digital transfer units connected in series.

13. The image sensor of claim 11, wherein the second transmission method is a method of sequentially transmitting the second bits of each of the serialized plurality of digital pixel signals to the application processor by the second layer via first to $M^{th}$ banks and first to $M^{th}$ samplers.

14. The image sensor of claim 13, wherein the first to $m^{th}$ samplers are synchronization circuits operating according to a clock signal.

15. A data transfer circuit that serializes a plurality of digital pixel signals and transmits the plurality of digital pixel signals to an application processor, the data transfer circuit comprising:
a first layer that transmits first bits of each of the plurality of digital pixel signals to the application processor by using a first transmission method, and
a second layer that transmits second bits of each of the plurality of digital pixel signals to the application processor by using a second transmission method, wherein:
the first bits are upper bits and the second bits are lower bits, and a ratio of the first bits to the second bits is variable.

16. The data transfer circuit of claim 15, wherein:
the first transmission method is a non-differential-signal transmission of the digital pixel signals, and
the second transmission method is a differential-signal transmission of the digital pixel signals.

17. The data transfer circuit of claim 15, wherein each of the first layer and the second layer comprises:
first to $M^{th}$ banks configured to convert the digital pixel signals into first to $M^{th}$ analog voltage signals, wherein 'm' denotes an integer which is greater than or equal to '2';
first to $M^{th}$ samplers configured to convert the first to $M^{th}$ analog voltage signals into first to $M^{th}$ digital transmission signals; and
first to $m^{th}$ digital transfer units configured to respectively receive the first to $m^{th}$ digital transmission signals.

18. The data transfer circuit of claim 17, wherein:
the first transmission method is a non-differential-signal transmission of the digital pixel signals through the $m^{th}$ digital transfer unit, and
the second transmission method is a differential-signal transmission of the digital pixel signals through the $m^{th}$ sampler.

* * * * *